(12) United States Patent
Mercaldi et al.

(10) Patent No.: US 7,651,956 B1
(45) Date of Patent: *Jan. 26, 2010

(54) PROCESS FOR FABRICATING FILMS OF UNIFORM PROPERTIES ON SEMICONDUCTOR DEVICES

(75) Inventors: Garry Anthony Mercaldi, Boise, ID (US); Don Carl Powell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1078 days.

This patent is subject to a terminal disclaimer.

(21) Appl. No.: 09/731,319

(22) Filed: Dec. 6, 2000

Related U.S. Application Data

(62) Division of application No. 09/041,913, filed on Mar. 13, 1998, now Pat. No. 6,833,280.

(51) Int. Cl.
*H01L 21/31* (2006.01)
*H01L 21/469* (2006.01)

(52) U.S. Cl. ............... 438/778; 438/780; 438/787; 438/788; 438/791; 438/792; 257/629; 257/632; 257/E23.131; 257/E23.132; 118/666; 118/725

(58) Field of Classification Search ............. 438/778, 438/788, FOR. 407, 684, 584, 149, 715, 695, 438/694, 14, 16, 573, 795; 117/86; 118/725, 118/724, 666; 427/248.1, 255.1, 81, 99; 219/492, 494, 497, 486, 491; 392/416

See application file for complete search history.

(56) References Cited

U.S. PATENT DOCUMENTS

| | | | |
|---|---|---|---|
| 4,132,818 A * | 1/1979 | Chappelow et al. ..... 427/248 R |
| 4,395,438 A | 7/1983 | Chiang ................. 438/791 |
| 4,742,020 A * | 5/1988 | Roy ..................... 438/149 |
| 4,872,947 A | 10/1989 | Wang et al. ............ 216/38 |
| 4,963,506 A | 10/1990 | Liaw et al. ............. 438/482 |
| 4,986,877 A * | 1/1991 | Tachi et al. ............ 156/643 |
| 5,034,688 A * | 7/1991 | Moulene et al. ........ 324/760 |
| 5,231,356 A | 7/1993 | Parker |
| 5,400,739 A | 3/1995 | Kao et al. ............... 117/86 |
| 5,436,172 A | 7/1995 | Moslehi ................. 374/121 |
| 5,482,739 A | 1/1996 | Hey et al. ............ 427/255.39 |
| 5,551,985 A | 9/1996 | Brors et al. ............. 118/725 |
| 5,571,603 A | 11/1996 | Utumi et al. ............ 428/212 |
| 5,607,773 A | 3/1997 | Ahlburn et al. ......... 428/427 |
| 5,618,761 A | 4/1997 | Eguchi et al. .......... 438/785 |
| 5,635,409 A | 6/1997 | Moslehi ................... 438/7 |
| 5,776,557 A | 7/1998 | Okano et al. ........... 427/579 |

(Continued)

FOREIGN PATENT DOCUMENTS

JP   10-206020   8/1998

*Primary Examiner*—Hsien-ming Lee
(74) *Attorney, Agent, or Firm*—TraskBritt

(57) ABSTRACT

A process for forming a thin layer exhibiting a substantially uniform property on an active surface of a semiconductor substrate. The process includes varying the temperature within a reaction chamber while a layer of a material is formed upon the semiconductor substrate. Varying the temperature within the reaction chamber facilitates temperature uniformity across the semiconductor wafer. As a result, a layer forming reaction occurs at a substantially consistent rate over the entire active surface of the semiconductor substrate. The process may also include oscillating the temperature within the reaction chamber while a layer of a material is being formed upon a semiconductor substrate.

53 Claims, 9 Drawing Sheets

U.S. PATENT DOCUMENTS

| | | | |
|---|---|---|---|
| 5,790,750 A * | 8/1998 | Anderson | 392/416 |
| 5,830,277 A | 11/1998 | Johnsgard et al. | 118/725 |
| 5,932,286 A | 8/1999 | Beinglass et al. | 427/255.18 |
| 5,967,661 A * | 10/1999 | Renken et al. | 374/126 |
| 5,970,383 A * | 10/1999 | Lee | 438/788 |
| 5,976,990 A | 11/1999 | Mercaldi et al. | 438/762 |
| 5,989,718 A | 11/1999 | Smith et al. | 428/466 |
| 6,083,852 A | 7/2000 | Cheung et al. | |
| 6,162,488 A * | 12/2000 | Gevelber et al. | 427/8 |
| 6,352,591 B1 | 3/2002 | Yieh et al. | |
| 6,537,677 B1 * | 3/2003 | Mercaldi et al. | 428/469 |

* cited by examiner

PROCESS FOR FABRICATING FILMS OF UNIFORM PROPERTIES ON SEMICONDUCTOR DEVICES

CROSS-REFERENCE TO RELATED APPLICATION

This application is a divisional of application Ser. No. 09/041,913, filed Mar. 13, 1998, now U.S. Pat. No. 6,833,280, issued Dec. 21, 2004.

BACKGROUND OF THE INVENTION

1. Field of the Invention

The present invention relates to processes to form a film of substantially uniform properties on the active surface of a semiconductor substrate, such as a semiconductor wafer or other structure, of silicon, polysilicon, gallium arsenide, silicon on insulator (SOI), silicon on sapphire (SOS), silicon on glass (SOG) or any other material which is useful as a semiconductor substrate in integrated circuit applications. Particularly, the process of the present invention includes forming films upon a semiconductor substrate at non-steady state temperatures in order to facilitate the substantially uniform properties of such films. The present invention also relates to processes for forming thin films having substantially uniform properties across the surface of a semiconductor wafer or other substrate during the formation of a layer of a material thereupon by creating temperature gradients between the center and edge of the semiconductor wafer.

2. Background of Related Art

As the integrated circuitry that is carried upon semiconductor substrates becomes ever-smaller and the surface area of such devices becomes ever-larger, the thermal output of such devices increases. Inconsistencies in the properties of the electrically conductive, semiconductive, and non-conductive layers of a semiconductor wafer including, without limitation, thickness, sheet resistance, reflectivity, transmissivity, absorptivity, dielectric constant, and various other characteristics of such layers, affect the electrical performance of semiconductor substrates, and therefore contribute, in part, to increased heat output, consequently higher operating temperatures, and other inefficiencies of many state-of-the-art semiconductor substrates.

The formation of films of substantially uniform properties on semiconductor wafer or other substrate active surfaces requires control over the rate at which chemical reactions occur over the active surface. Since elevated temperatures drive these layer-forming reactions, the ability to control the uniform distribution of reactants over a semiconductor wafer's active surface is affected by the temperature of the region of the semiconductor wafer that lies therebeneath and the concentration of the reactants thereabove. If the temperature is uniform (i.e., a temperature gradient does not exist) across the active surface of a semiconductor wafer, reaction rate gradients may develop thereover, which phenomenon leads to variations in the properties of the layers formed on the active surface. Thus, during the fabrication or formation of layers on semiconductor wafers, a lack of temperature gradients thereacross is undesirable.

Various techniques are known in the art for forming layers on the active surface of semiconductor wafers or other substrates. One such technique, known as single wafer optical processing, combines low thermal mass photon-assisted rapid wafer heating with reactive ambient semiconductor processing. Optical processing permits the rapid alteration of both the temperature of the semiconductor substrate and the process environment. Consequently, each of the fabrication steps and their sub-processes may be independently optimized in order to improve the overall electrical performance of the resulting semiconductor substrates.

Another technique that is conventionally employed to form layers on the active surface of semiconductor substrates is known as rapid thermal processing (RTP). Rapid thermal processing techniques typically employ radiant energy to heat the semiconductor substrate to very high temperatures (e.g., 420° C. to 1150° C.) for short time periods. The widespread use of rapid thermal processing may, in part, be due to the repeatable quality of the films formed thereby. Rapid thermal processing may be employed to form oxide layers, nitride layers, doped layers, and to perform different types of thermal anneals of layers on semiconductor substrates.

Similarly, several types of chemical vapor deposition chambers and techniques are conventionally employed to form dielectric layers (e.g., oxides, nitrides, and advanced dielectrics), semiconductor layers (e.g., amorphous silicon and polysilicon), and electrically conductive layers (e.g., aluminum, copper, tungsten, and titanium nitride), on semiconductor substrate active surfaces.

Many such techniques, however, are unable to generate or maintain substantially uniform amounts of layer-forming reactions across the surface of semiconductor wafers and, therefore, do not form thin films of uniform properties upon the active surface of semiconductor wafers. Such conventional layer formation techniques typically utilize steady-state conditions (i.e., the reaction temperature is maintained within a typically small predetermined range), which often permit the formation of significant reaction rate gradients across the active surface of the semiconductor wafer, thereby limiting the uniformity of films formed thereon. Thus, by maintaining a stable temperature during layer formation, many of these conventional systems actually impede a uniform reaction across the surface of the semiconductor wafers. Consequently, layers of non-uniform properties form on the semiconductor wafers. Further, with many of the current layer formation techniques, as the size of semiconductor wafers increases, and larger non-wafer semiconductor substrates become more commonly used, variations in layer properties become more pronounced due to the greater depletion of reactants over some regions thereof than other regions thereof.

U.S. Pat. No. 5,635,409 (the "'409 patent"), issued to Mehrdad M. Moslehi on Jun. 3, 1997, discloses a control system and process that attempt to reduce or eliminate the development of temperature gradients (i.e., optimize process uniformity) over semiconductor wafer active surfaces during each of the heat-up, steady-state heating and cool-down phases by monitoring and adjusting the reaction chamber temperature at various locations. According to the process of the '409 patent, the semiconductor substrate and reaction chamber temperatures are adjusted in a linear fashion during the heat-up and cool-down phases.

However, use of the control system of the '409 patent is somewhat undesirable since it creates and maintains a substantially uniform or "steady state" temperature over the semiconductor wafer that, as explained above, does not facilitate, and actually impedes, reaction rate uniformity. Moreover, due to the ever-increasing size of semiconductor wafers and other substrates, the maintenance of a constant temperature over the surface of such semiconductor wafers may further decrease the uniformity of properties of thin films formed thereon.

The generation and maintenance of a uniform temperature across a semiconductor wafer may, however, be desirable while forming layers of some materials on the semiconductor wafer. For example, uniform semiconductor wafer temperatures are desirable during dopant diffusion processes, metal salicidation processes, and where multiple layers having different coefficients of expansion are being formed upon the semiconductor wafer and annealed to one another. Conventional layer formation processes which generate and maintain uniform semiconductor wafer temperatures, however, may also induce stress on the semiconductor wafer, which may in turn cause lattice defects in the semiconductor wafer, such as point, line, or area slip defects.

Thus, a need exists for a process forming films of substantially uniform properties on the active surface of semiconductor substrates, while reducing stress on the semiconductor substrates.

BRIEF SUMMARY OF THE INVENTION

The present invention addresses each of the foregoing needs by forming material layers upon a semiconductor substrate under non-steady state temperature conditions. Stated another way, the inventive process forms layers during non-steady state phases, such as ramp-up and ramp-down of the reaction chamber temperature, rather than during a phase where the temperature of a reaction chamber or furnace is held steady.

In a first embodiment of the process of the present invention, a layer is formed upon a semiconductor substrate during a ramp-up of the reactor temperature. Deposition under such conditions of increasing temperature facilitates the formation of a layer of substantially uniform properties over the semiconductor substrate. The first embodiment of the process of the present invention is particularly useful for forming layers of materials upon semiconductor substrates, which materials, where used to form layers by conventional steady-state techniques, typically result in a material layer thinner at the edge region of a semiconductor substrate than at the center region thereof.

A second embodiment of the process of the present invention includes the formation of a material layer during a controlled ramp-down of the reactor temperature, during which the temperature at the edge region of the semiconductor substrate is cooler than that at the center region thereof. The second embodiment facilitates the formation of uniform property layers of materials which, where employed with conventional steady-state layer forming techniques, typically result in layers thicker at the edge regions of a semiconductor substrate than at the center region thereof.

In both the first and second embodiments of the inventive process, a layer may be formed in multiple steps, where more than one ramp-up or ramp-down is employed in order to form the layer.

In another embodiment of the inventive process, the reaction chamber temperature is intermittently varied, continually fluctuated or oscillated in order to provide a substantially uniform reaction over the semiconductor substrate while forming a layer thereon. Such fluctuation in the temperature of the reaction chamber may be effected during the ramp-up, the ramp-down, and/or the so-called "steady state" temperature trends. During such fluctuation of the temperature of the reaction chamber, the temperature profile, plotted temperature (y-axis coordinate) over time (x-axis coordinate), may have a saw-tooth (i.e., linear, with small variations) or a humped configuration. Such variation of the reaction temperature equalizes the reaction rate across the surface of the semiconductor substrate and may be effected by existing fabrication equipment.

Semiconductor substrates which include material layers formed in accordance with the processes of the present invention are also within the scope of the present invention.

Other advantages of the present invention will become apparent to those of ordinary skill in the relevant art through a consideration of the appended drawings and the ensuing description.

DETAILED DESCRIPTION OF THE INVENTION

The process of the present invention includes the formation of a material layer, or film, upon an active surface of a semiconductor wafer or other substrate under non-steady state temperature conditions. "Non-steady state," as used herein, refers to varying, oscillating, continually fluctuating, or summing reaction chamber temperatures with one or more signals of varying frequency, amplitude or phase. Such layers or films may be formed by known deposition or growth techniques or reactions that are modified by employing temperature variation according to the process of the present invention, and using known equipment programmed to effect such temperature variation during the formation of the layer or film. Such deposition and growth techniques include introducing into the reaction chamber matter of a type that promotes the formation of a material layer upon the substrate in proximity to an exposed surface of the substrate.

Temperature variation according to the process of the present invention may be effected by altering one or more characteristics of the power that is required by a heat generating source, such as a conventional furnace or a rapid thermal processing system. Various characteristics of the power that may be altered in order to effect temperature variation include frequency, amplitude and phase. Similarly, multiple power frequencies may be summed. Altering such characteristics of the heat-generating power facilitates creation of temperature variations of virtually any profile, as may be illustrated by a line graph wherein temperature is plotted over time. Alternatively, the temperature variation of the process of the present invention may be effected by setting the process chamber to a predetermined, fixed temperature profile, which is also referred to as a temperature set point profile. A feedback control system of the type known in the art may be employed to alter the amount of power that is input into the process chamber in order to increase, maintain, or reduce the amount of heat that is generated in the process chamber and thereby substantially emulate the temperature set point profile.

The use of non-steady state temperature conditions facilitates the formation of a layer of a material that includes substantially uniform properties. The term "properties" is used herein as comprising one or more of the thickness, sheet resistance, reflectivity, transmissivity, absorptivity, dielectric constant, and various other characteristics of the layer.

Figure 1:
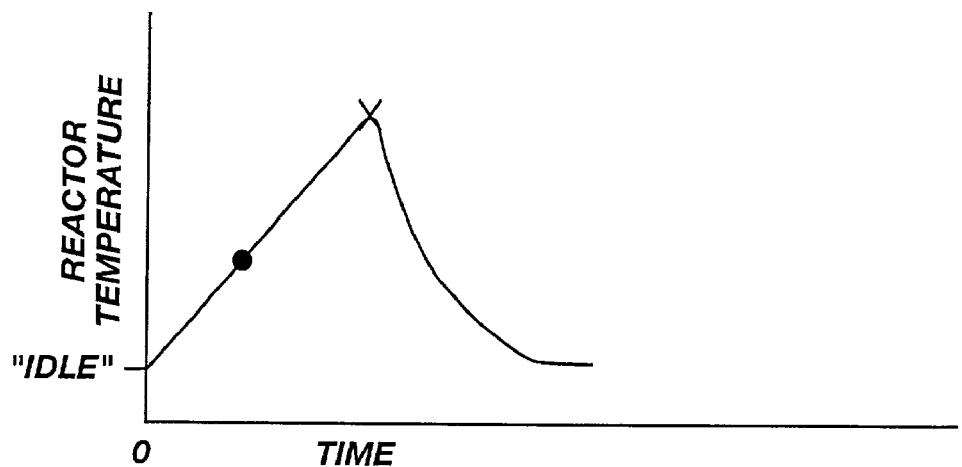
FIG. 1 is a line graph illustrating the heat-up phase temperatures, plotted over time, at which a layer of a material may be formed upon a semiconductor wafer in accordance with a first embodiment of the process of the present invention.

With reference to FIG. 1, which is a line graph that depicts the temperature of a reaction chamber (y-axis) plotted against time (x-axis), a first embodiment of the process of the present invention includes forming a material layer upon a semiconductor wafer during a heat-up phase, which is typically referred to as a ramp-up of the temperature of the environment that surrounds the semiconductor wafer, which is also referred to for simplicity as the reaction chamber temperature. Thus, the layer is formed while the temperature of the semiconductor wafer increases from a first temperature, represented as ●, to a second temperature, represented as X. As those of skill in the art are aware, as the reaction chamber temperature is increased, a semiconductor wafer's edge region heats up more quickly than its center region. Thus, during the heat-up phase, the edge region of the semiconductor wafer is typically a higher temperature at a given point in time than the center region of the same.

The first embodiment of the process is particularly useful for enhancing the uniformity of materials that, under steady state reaction chamber temperature conditions, form thicker layers at the center region of a semiconductor wafer than at the edge region of the same due to a higher reaction rate at the center region than at the edge region since, in some layer formation processes, fewer reactants are available at the edge region than at the center region of a semiconductor wafer, which may result in the formation of a layer with a "convex" or "dome" (i.e., inverted "bowl" or "dish") shaped contour. Thus, the process of the present invention is useful for preventing the "convex" or "dome" (i.e., inverted "bowl" or "dish") shaped contours of layers that are typically formed by many conventionally employed processes which deposit or grow layers on semiconductor wafers under steady state temperature conditions. As explained previously, such non-uniformities are typically caused by the differential depletion of reactants, or the creation of reactant gradients, over the surface of the semiconductor wafer.

The formation of a doped amorphous silicon layer of substantially uniform properties is exemplary of the first embodiment of the process of the present invention. Typical conventional doped amorphous silicon deposition techniques, such as the exemplary process that is disclosed in U.S. Pat. No. 4,963,506 ("the '506 patent), which issued to Hang M. Liaw, et al. on Oct. 16, 1990, the disclosure of which is hereby incorporated herein by reference in its entirety, occur under steady state conditions within a reaction chamber that has been heated to between about 500° C. and 600° C. In contrast, the deposition of doped amorphous silicon in accordance with the first embodiment of the present invention occurs while the reaction chamber temperature is being increased to about 600° C. First, a semiconductor wafer upon which the doped amorphous silicon layer is to be formed is placed into a reaction chamber while the temperature within the chamber is held at "idle" (e.g., a temperature of about 500° C.). The temperature within the reaction chamber is then increased. As the reaction chamber reaches a desirable initial deposition temperature (e.g., about 525° C. for doped amorphous silicon), the appropriate, conventionally employed reactants are introduced therein. The rate at which the reaction chamber temperature is subsequently increased and the amount of the temperature increase is dependent upon several factors, including without limitation the specific type of material that is being deposited, the desired layer properties and the desired level of layer uniformity. The introduction of reactants into the reaction chamber continues until the temperature within the reaction chamber reaches a desired terminal deposition temperature (e.g., about 500° C. to 550° C. for doped amorphous silicon), at which temperature the introduction of reactants is stopped. Subsequently, the temperature within the reaction chamber is decreased to the "idle" temperature and the semiconductor wafer may be removed therefrom.

For the purpose of comparison, a layer of doped amorphous silicon was formed upon a semiconductor wafer in accordance with a conventional steady state deposition technique while the semiconductor wafer was being rotated. The doped amorphous silicon layer had a "convex" or "dome" shaped contour, indicating that the doped amorphous silicon layer is thicker at the center region of the semiconductor wafer than at the edge region of the same. The doped amorphous silicon layer that was deposited by a prior art technique varied about 35 Å from its thickest measured point (1015.81 Å), near the center region of the semiconductor wafer, to its thinnest measured point (979.33 Å), near the wafer's edge region, which is a variation of about 3.5% from the median thickness (about 1002 Å) of the layer; thus, the standard deviation of the variation in thickness was about 1.2%.

In contrast, a doped amorphous silicon layer that was formed on a semiconductor wafer in accordance with the first embodiment of the inventive process, as explained above, exhibited a more uniform thickness than that of the conventional technique described in the preceding paragraph, as evidenced by the lack of an inverted "bowl" or "dish" shaped contour. Stated in relative terms, the doped amorphous silicon layer varied only about 8 Å from its thickest measured point (1003.72 Å) to its thinnest measured point (995.65 Å), which is a variation of only about 0.8% from the median thickness (1001.20 Å) of the layer; thus, the standard deviation of the variation in thickness was only about 0.25%. The doped amorphous silicon layer that was formed in accordance with the first embodiment of the inventive process had about one-fifth to about one-sixth the variation in thickness of the doped amorphous silicon layer as a doped amorphous silicon layer of similar overall thickness that was deposited under prior art steady state temperature conditions.

Similarly, a layer of doped polysilicon may be formed in accordance with the first embodiment of the inventive process. Typical conventional doped polysilicon deposition techniques, such as the exemplary process that is disclosed in the '506 patent, occur under steady state conditions within a reaction chamber that has been heated to between about 600° C. and 700° C. In contrast, the deposition of doped polysilicon in accordance with the first embodiment of the present invention occurs while the reaction chamber temperature is being increased from an initial temperature to about 580° C. to about 680° C., or as high as about 800° C. First, a semiconductor wafer upon which the doped amorphous silicon layer is to be formed is placed into a reaction chamber while the temperature within the chamber is held at "idle" (e.g., a temperature of about 500° C.). The temperature within the reaction chamber is then increased. As the reaction chamber reaches a desirable initial deposition temperature (e.g., about 575° C. to about 585° C. for doped polysilicon), the appropriate, conventionally employed reactants are introduced therein. The introduction of reactants into the reaction chamber continues until the temperature within the reaction chamber reaches a desired terminal deposition temperature (e.g., about 675° C. for doped polysilicon). Subsequently, the temperature within the reaction chamber is decreased to the "idle" temperature and the semiconductor wafer may be removed therefrom.

Figure 2:
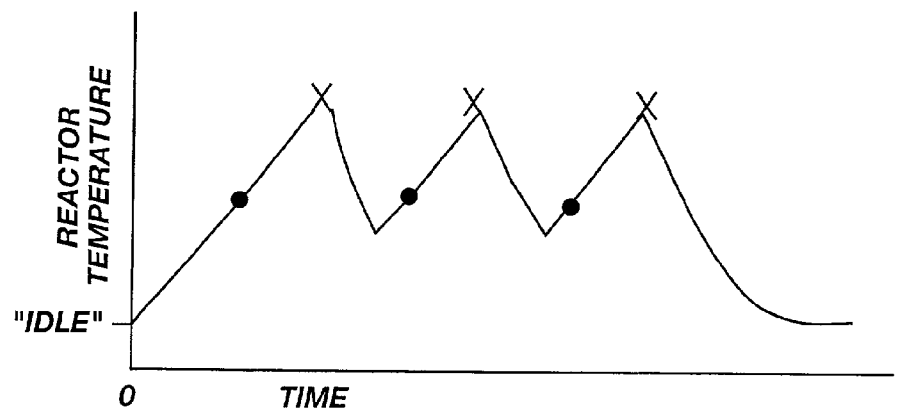
FIG. 2 is a line graph which depicts a variation of the process of FIG. 1, wherein the heat-up phase and deposition during the same are repeated.

The line graph of FIG. 2 depicts a variation of the first embodiment wherein, following the formation of a portion of a layer while the temperature of the reaction temperature is between first temperature ● and second temperature X and reduction of the temperature within the reaction chamber, the heat-up phase may be repeated at least once to form another portion of the layer. Such repetitious heating-up is particularly useful for forming layers of materials which require a large increase in temperature over a relatively short period of time. Preferably, when such repetitious heating is employed in accordance with the first embodiment of the process, layer formation is effected only during the heat-up phases of the cycle (i.e., during temperature increases).

Figure 3:
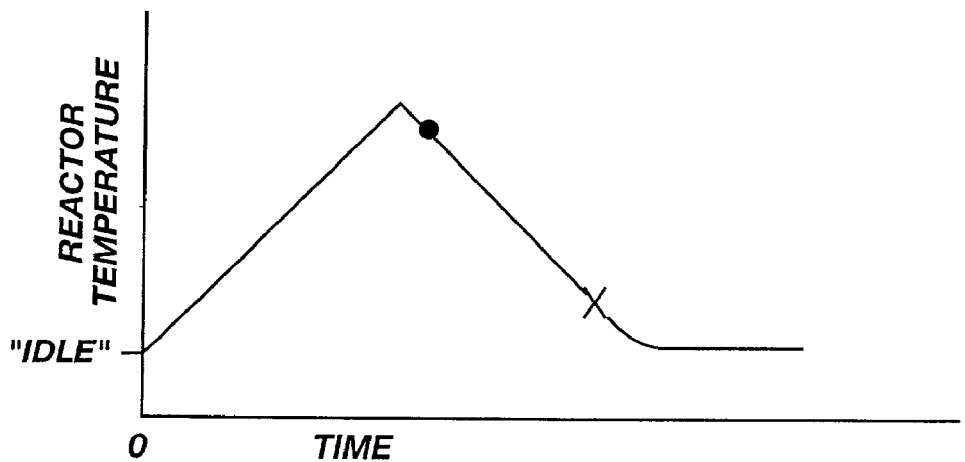
FIG. 3 is a line graph illustrating the cool-down phase temperatures, plotted over time, at which a layer of a material may be formed upon a semiconductor wafer in accordance with a second embodiment of the process of the present invention.

FIG. 3 illustrates a second embodiment of the process of the present invention, wherein a layer is formed upon a semiconductor wafer during a cool-down phase, which is typically referred to as a ramp-down in the reaction chamber temperature. Formation of the layer begins after the temperature within the reaction chamber reaches a first temperature ●, and continues until the temperature within the reaction chamber drops to a second temperature X. Thus, deposition occurs in accordance with the second embodiment of the process as the semiconductor wafer is cooled down. Preferably, the temperature within the reaction chamber is decreased at a controlled rate. The amount of temperature decrease and the rate at which the temperature is decreased are dependent upon the material from which a layer is formed. As those of skill in the art are aware, a semiconductor wafer's edge region cools at a faster rate than the center region of the same. Thus, during the cool-down phase, the temperature of the edge region of the semiconductor wafer is typically lower at a given point in time than that of its center region.

The second embodiment of the inventive process is particularly useful for facilitating the formation of layers of substantially uniform properties from materials that, under steady state temperature conditions, form thinner layers at the center region of a semiconductor wafer than at its edge region. Thus, the second embodiment of the process is useful for preventing the formation of layers having concave "bowl" or "dish" shaped contours, which may occur when conventional techniques are employed.

For example, when conventional low pressure chemical vapor deposition (LPCVD) techniques, such as the exemplary process that is disclosed in U.S. Pat. No. 4,395,438 (the "'438 patent"), which issued to Ping-Wang Chiang on Jul. 26, 1983, the disclosure of which is hereby incorporated herein by reference in its entirety, are employed to form silicon nitride ($Si_3N_4$) layers on semiconductor wafers, the steady state temperatures within the reaction chamber are typically in the 700° C. to 800° C. range. Silicon nitride deposition in accordance with the process of the present invention includes a controlled ramp-down of the temperature within the reaction chamber from about 780° C. to about 645° C., during which the appropriate, conventionally employed chemical reactants are introduced into the reaction chamber.

Figure 4:
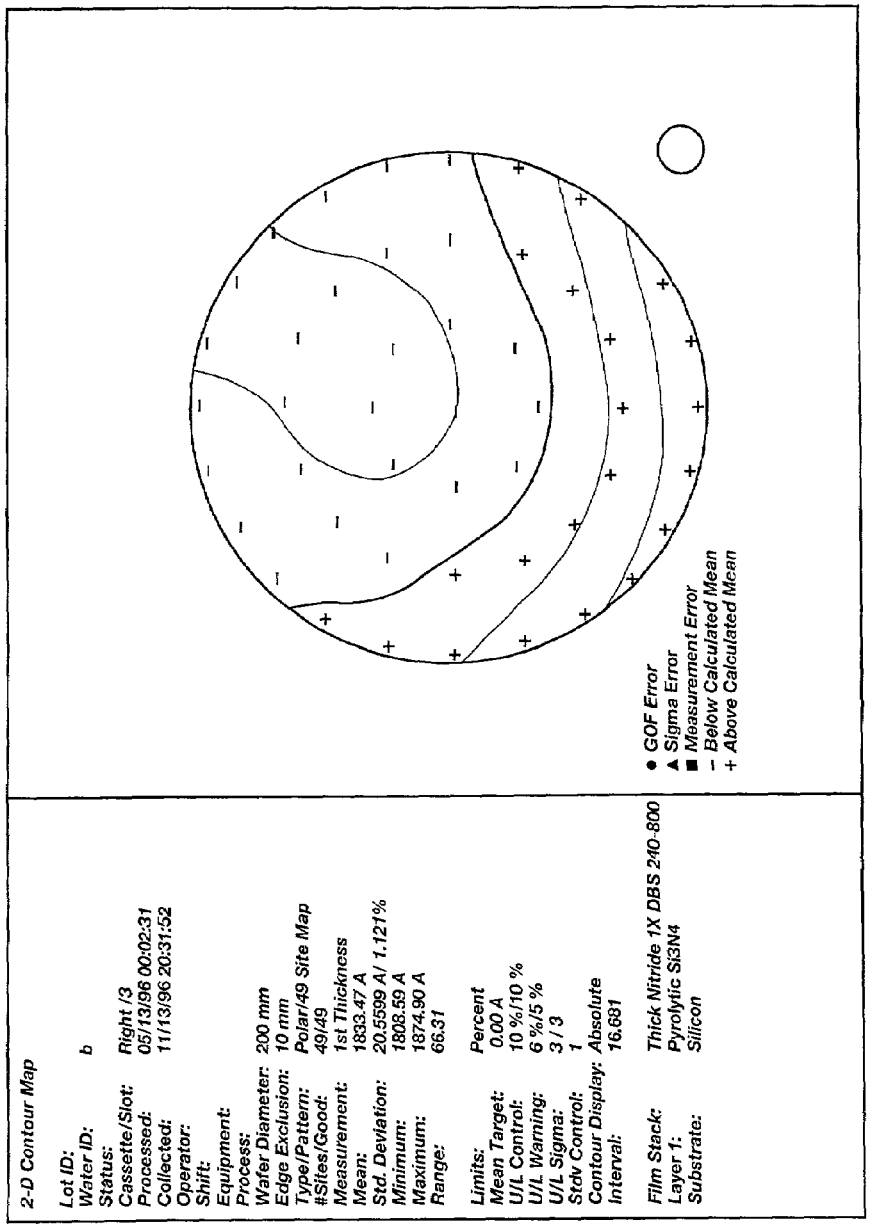
FIG. 4 is a 49 point contour map which depicts a silicon nitride layer that was formed by prior art techniques.
Figure 5:
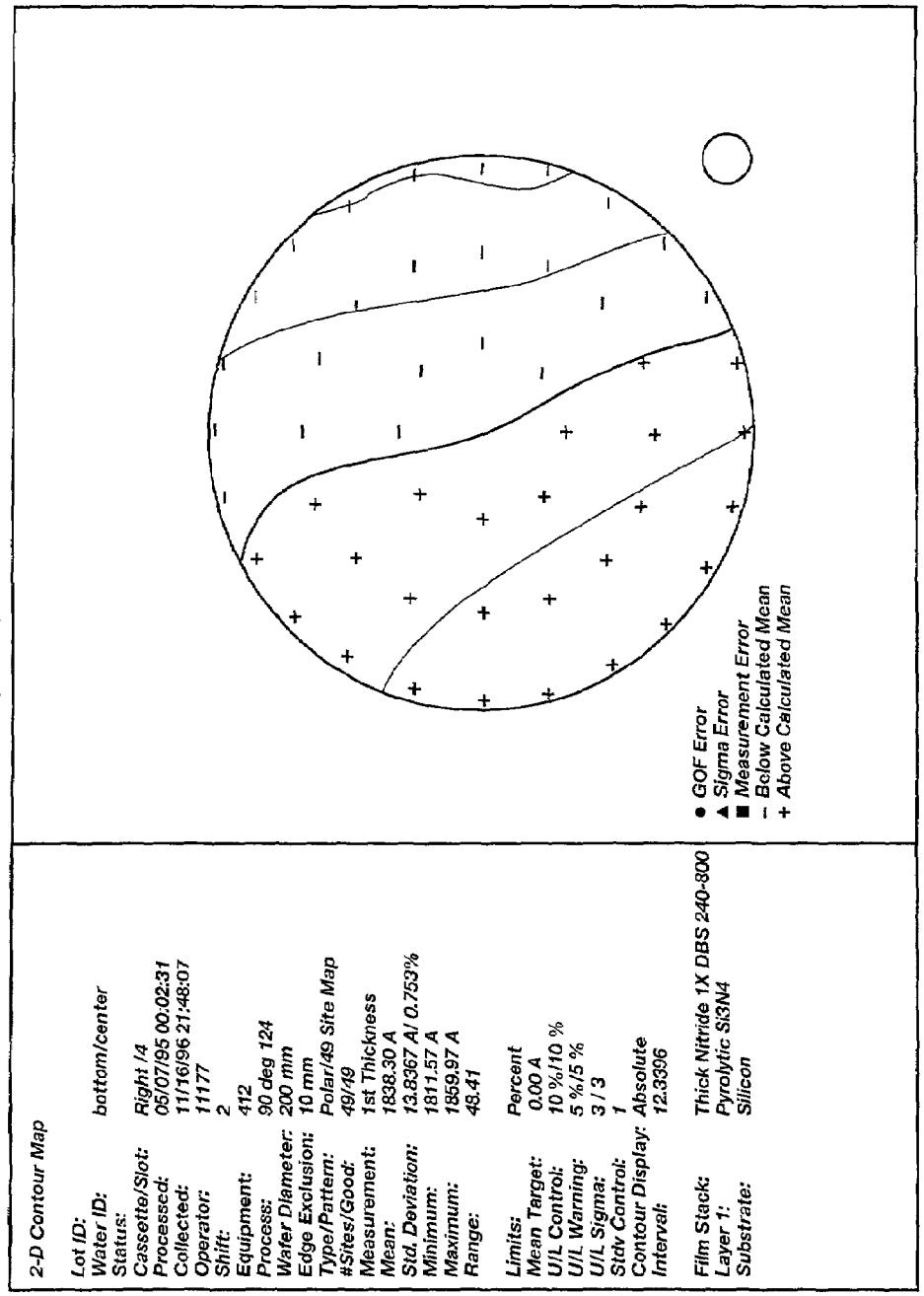
FIG. 5 is a 49 point contour map which depicts a layer that was formed in accordance with a second embodiment of the process of the present invention.

FIGS. 4 and 5 are 49 point contour maps of semiconductor wafers bearing thick (i.e., 1,800 Å to 2,000 Å) silicon nitride layers. The contour map of FIG. 4 illustrates the thickness of a silicon nitride layer that has been formed upon a semiconductor wafer in a hot wall furnace by conventional steady state temperature deposition techniques. The silicon nitride layer shown in FIG. 4 has a "bowl" or "dish" shaped contour, which is typically caused by reactant gradients over the surface of a semiconductor wafer. As noted previously, when conventional techniques are employed which utilize steady state temperatures throughout the reaction chamber, the reaction rate of the edge region of a semiconductor wafer is higher than the temperature of the center region of the same. Additionally, it is known in the art that thicker layers of some materials form upon the higher temperature regions of a semiconductor wafer than upon the lower temperature regions thereof. Consequently, the use of steady state reaction temperatures throughout a deposition process may result in the formation of a silicon nitride layer having non-uniform properties due to the generation of reactant gradients thereabove. As illustrated by FIG. 4, the layer is thicker at the edge region of the semiconductor wafer than at its center region. The thickness of the silicon nitride layer varied, from its thinnest measured point (1,808.59 Å) to its thickest measured point (1,874.90 Å), by about 66 Å, which is about 3.6% of the total average layer thickness (1,833.47 Å); thus, the standard deviation in layer thickness was about 1.1%.

In contrast, FIG. 5 is a contour map which depicts the thickness of a silicon nitride layer that has been formed upon a semiconductor wafer in accordance with the second embodiment of the process of the present invention (i.e., during a cool-down phase). The silicon nitride layer of FIG. 5 has a more uniform thickness than that of FIG. 4. The silicon nitride layer varied about 48 Å from its thickest measured point (1,859.97 Å) to its thinnest measured point (1,811.57 Å), which is a variation of about 2.6% from the median thickness (1,836.30 Å) of the layer; thus, the standard deviation of the variation in thickness was only about 0.75%. Moreover, the thickness of the silicon nitride layer depicted in FIG. 5 does not create the bowl shaped contour of FIG. 4, indicating that when the process of the present invention is employed in order to form a silicon nitride layer upon a semiconductor wafer, the rate at which such a layer is formed on the edge region of the semiconductor wafer is not significantly higher than the rate at which a layer is formed on the center region of the same.

Similarly, an oxide layer may be formed upon a semiconductor wafer in accordance with the second embodiment of the present invention by techniques that employ tetraethyl-ortho-silicate (TEOS), such as the exemplary process that is disclosed in U.S. Pat. No. 4,872,947 (the "'947 patent"), which issued to David N. Wang et al. on Oct. 18, 1989, the disclosure of which is hereby incorporated herein by reference in its entirety. A semiconductor wafer upon which a layer of TEOS is to be formed is positioned within a reaction chamber while the temperature within the chamber is at an "idle" temperature for conventional TEOS layer formation, about 500° C. The temperature within the reaction chamber is then increased to at least about the temperature at which TEOS layer formation by conventional processes occurs, about 600° C. to about 625° C., which is referred to as a first temperature. A controlled ramp-down of the temperature within the reaction chamber to a second, or termination, temperature is then effected. During the controlled ramp-down, the appropriate, conventionally employed chemical reactants are introduced into the reaction chamber, wherein a TEOS layer forms on a surface of the semiconductor wafer. After a TEOS layer of the desired thickness has been formed, the temperature within the reaction chamber may be reduced to "idle" and the semiconductor wafer removed therefrom.

A TEOS layer that has been formed in accordance with the second embodiment of the process of the present invention has substantially uniform properties. Such an exemplary TEOS layer, which was formed upon a semiconductor wafer that was positioned centrally in a reaction chamber, varied only about 38 Å from its thickest measured point (1511 Å) to its thinnest measured point (1474 Å), which is a variation of only about 2.5% from the median thickness (1484 Å) of the TEOS layer. In contrast, a TEOS layer that was formed under steady state conditions by conventional processes varied about 104 Å from its thickest measured point (1557 Å) to its thinnest measured point (1453 Å), which is a variation of about 7.0% from the median thickness (1496 Å) of the conventionally-formed TEOS layer.

Similarly, in comparison to conventional layer forming techniques, the second embodiment of the process of the present invention was useful for forming TEOS layers of substantially uniform properties upon semiconductor wafers that were positioned near the top and near the bottom of the reaction chamber. A TEOS layer that was formed upon a semiconductor wafer that was positioned near the top of the reaction chamber, and in accordance with the second embodiment, varied about 70.4 Å from its thickest measured point to its thinnest measured point, with a mean thickness of 1465.4 Å. Thus, the TEOS layer had a thickness variation of 4.8% of the mean layer thickness. In contrast, the variation in thickness (114.9 Å) of a conventionally formed TEOS layer that was formed upon a similarly positioned semiconductor wafer varied 7.8% from the mean thickness (1471.7 Å) thereof.

Similar results occurred when TEOS layers were formed on semiconductor wafers that were positioned near the bottom of the reaction chamber. When the second embodiment of the inventive process was employed, the variation in thickness of the TEOS layer was 4.5% (a range of 64.6 Å) of the mean thickness (1433.3 Å) of the same. A conventionally formed TEOS layer, however, varied 9.6% (a range of 147.0 Å) from the mean thickness (1527.8 Å) thereof. Thus, the TEOS layer that was formed in accordance with the second embodiment of the process of the present invention had about one-half to about one-third of the thickness variation of the conventionally formed TEOS layer.

Figure 6:
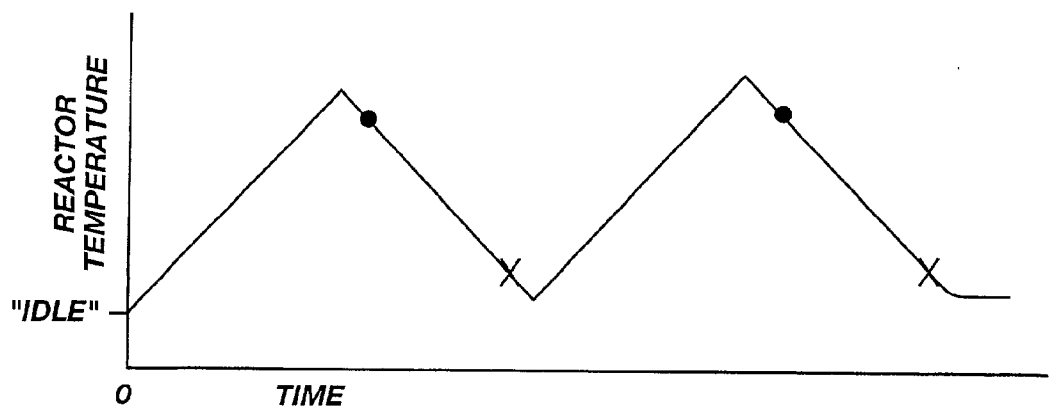
FIG. 6 is a line graph which depicts a variation of the process of FIG. 3, wherein the cool-down phase and deposition during the same are repeated.

FIG. 6 is a line graph which illustrates the temperature of a reaction chamber plotted over time during repetitious cool-down phases. Similar to the repetitious heating-up that was explained above in reference to the first embodiment of the inventive process, a variation of the second embodiment of the inventive process includes the repetitious cooling-down of the temperature within the reaction chamber from first temperature ● to second temperature X in order to facilitate the formation of a substantially uniform layer upon a surface of a semiconductor wafer. Such repetitious cooling-down is particularly useful for forming layers of materials that require a small temperature change and for forming layers which require a large decrease in temperature over a relatively short period of time. Preferably, when such repetitious cooling-down is employed, layer formation is effected only during the cool-down portions of the cycle.

In another embodiment of the layer formation process of the present invention, the temperature within the reaction chamber may be oscillated, fluctuated, or intermittently varied during at least a portion of any of the heat-up, substantially steady state, or cool-down phases, or any combination thereof. Such intermittent variation of the temperature generates and maintains a substantially uniform temperature over the surface of a semiconductor wafer. Temperature uniformity over the surface of a semiconductor wafer is desirable for layer forming processes including, without limitation, dopant diffusion, alloying or any other diffusion-limited process, and the formation of multiple layers having different coefficients of expansion. Additionally, the generation of substantially uniform temperature over a semiconductor wafer may reduce or eliminate stresses that may result in the formation of lattice defects, such as point, line (e.g., slip, straight dislocations, dislocation loops, etc.), area, volume, or other thin film defects.

Figure 7:
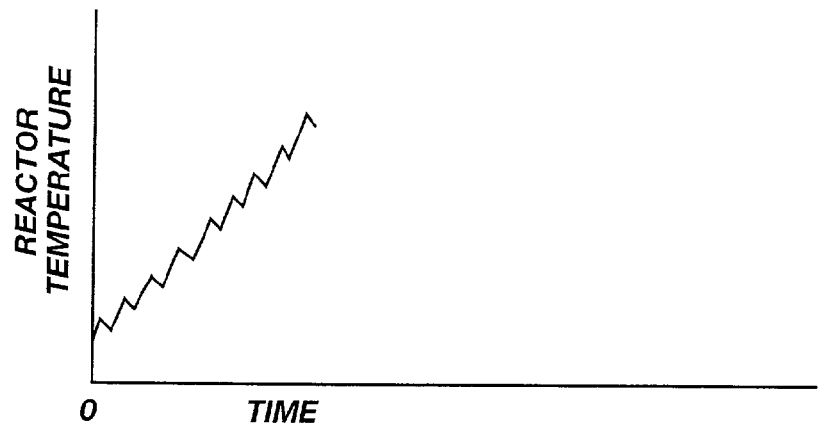
FIG. 7 is a line graph which illustrates the heat-up phase temperatures over time as another embodiment of the process of the present invention is employed to form a layer upon a semiconductor wafer.
Figure 7A:
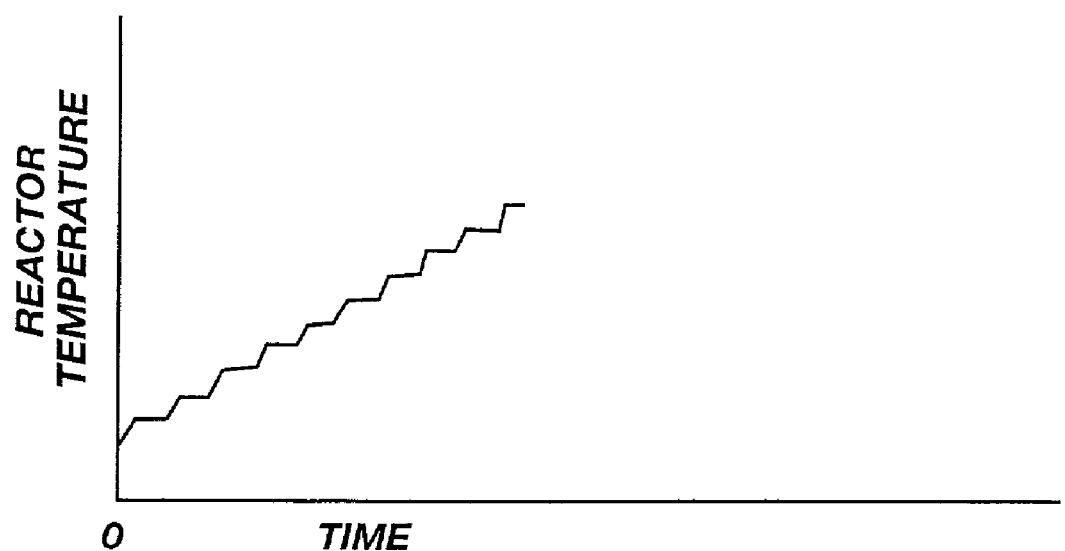
FIG. 7a is a line graph which illustrates the heat-up phase temperatures over time as a variation of the process of FIG. 7 is employed to form a layer upon a semiconductor wafer.

During the heat-up phase, the process of the present invention may include an oscillating increase in the temperature within the reaction chamber. As the temperature within the reaction chamber is ramped up during the heat-up phase, each increase in reactor temperature is followed by a temperature decrease. As illustrated by FIG. 7, a linear graph of such a heat-up phase, wherein temperature is plotted over time, includes fluctuations in temperature which impart the graph with a saw tooth, or a zig-zag configuration. Other oscillating heat-up patterns are also within the scope of the present invention, as are less predictable variations in the reactor temperature during the heat-up or anneal phases. The amount of temperature variation between the high and low points of each zig-zag and the durations of each temperature increase and subsequent temperature decrease are optimized in order to provide uniform temperatures across the semiconductor wafer at all times during the formation of a layer or film thereon. This embodiment of the present invention facilitates a uniform cross-wafer temperature during either of the heat up or cool down phases. Although the graph of FIG. 7 represents each fluctuation as an increase in temperature followed by a smaller decrease in temperature, temperature increases that are followed by no change (as illustrated by FIG. 7a) in temperature for a period of time or by lower rate temperature increases are also within the scope of the present invention.

The oscillating increase in the reaction chamber temperature during the heat-up phase facilitates a uniform increase in the temperature across the various regions of a semiconductor wafer, including its edge region and center region. As those of skill in the art are aware, as the temperature within many conventional reaction chambers is increased, a semiconductor wafer's edge region heats up more quickly than its center region. Thus, during the heat-up phase, the rate at which the temperature of the center region of a semiconductor wafer increases typically lags behind the rate at which the temperature of its edge region increases. Similarly, the rate at which the temperature of the center region decreases lags behind the rate at which the temperature of the wafer's edge region decreases. By intermittently decreasing the temperature within the reaction chamber for short periods of time, the temperature of the edge region of a semiconductor wafer decreases, while the temperature of the center region remains substantially the same, permitting the temperature of the center region of a semiconductor wafer to "catch up" to the temperature at the edge region of the wafer, thereby equalizing the temperature across the semiconductor wafer's active surface during the heat-up phase, and reducing or eliminating the generation of any temperature gradients thereon in order to facilitate the formation of a layer of substantially uniform properties thereupon and reducing the amount of stress that is induced on a semiconductor wafer, thereby potentially decreasing the occurrence of semiconductor wafer lattice defects, such as point, line, and area slip defects.

Figure 8:
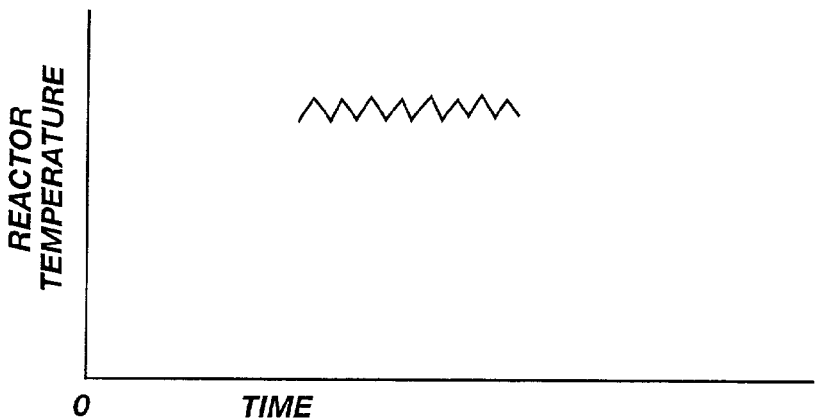
FIG. 8 is a line graph which illustrates the deposition phase temperatures over time as the process of FIG. 7 is employed to form a layer upon a semiconductor wafer.

Oscillation of the temperature within the reaction chamber may also be effected during a so-called "steady state," or "conventional" anneal phase, which is also referred to as a substantially steady state temperature trend. As in the heat-up phase, oscillation, fluctuation, or intermittent variation of the temperature within the reaction chamber maintains a substantially uniform temperature over the surface of a semiconductor wafer during the "conventional" anneal phase. FIG. 8 is a line graph which illustrates the temperature within the reaction chamber plotted over time during a "conventional" anneal phase. Although the graph line is saw tooth configured, as explained previously, each temperature increase is not necessarily followed by a decrease in temperature. Similarly, other oscillating heat-up patterns and less predictable variations in the temperature of the surrounding environment during the "conventional" anneal phase are also within the scope of the present invention. During the "conventional" anneal phase, the temperature may remain within a predetermined range.

Varying the reactor temperature to which a semiconductor wafer is subjected during a "conventional" anneal phase has essentially the same effect as described above in reference to the heat-up phase. Under steady state temperature conditions, the edge region of a semiconductor wafer absorbs thermal energy more quickly than the wafer's center region, which may create a temperature gradient over the active surface of the wafer. The edge region of a semiconductor wafer also, however, dissipates thermal energy at a higher rate than the center region. Thus, by constantly varying the reactor temperature during the "conventional" anneal phase, the semiconductor wafer's temperature substantially equalizes, facilitating the maintenance of a substantially uniform temperature over all regions of the semiconductor wafer.

Temperature oscillation during the cool-down phase, similar to that described above in reference to the heat-up and "conventional" anneal phases, may also be employed in accordance with the process of the present invention. The edge region of a semiconductor wafer dissipates thermal energy (i.e., cools down) more quickly than the wafer's center region. Stated another way, the rate at which the center region of a semiconductor wafer cools is less than the rate at which its edge region cools. Since the layer formation may continue into the cool-down phase, it is necessary to control the temperature so as to maintain a uniform temperature across the semiconductor wafer's active surface during that phase. By intermittently increasing or maintaining the temperature within the reaction chamber during the cool-down phase, thermal energy is added to the cooler edge region of a semiconductor wafer. Thus, the wafer's edge region is heated up to equalize temperatures across the wafer during the cool-down phase.

Figure 9:
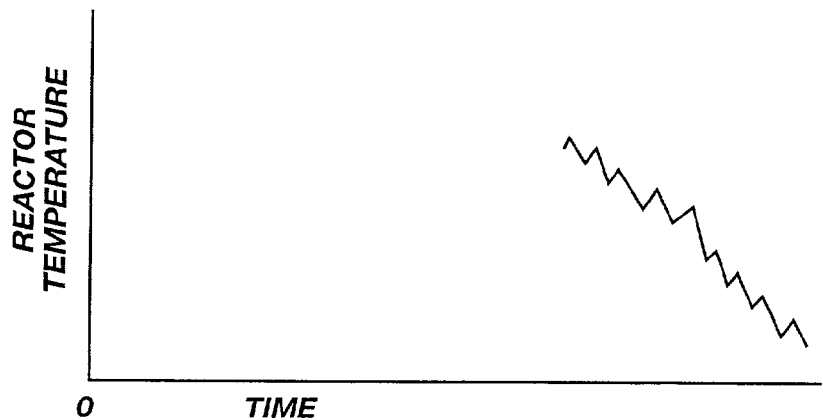
FIG. 9 is a line graph which illustrates the cool-down phase temperatures over time as the process of FIG. 7 is employed to form a layer upon a semiconductor wafer.

Referring now to FIG. 9, which is a line graph which illustrates the temperatures of the cool-down phase over time as the temperature oscillation process of the present invention is employed to form a layer upon a semiconductor wafer, the temperature is intermittently varied, as described above in reference to the heat-up and "conventional" anneal phases.

Maintaining a uniform temperature across a semiconductor wafer during the cool-down phase may also prevent the formation of any discontinuities or other flaws that may be induced by non-uniform cooling of the newly formed layer and/or the semiconductor wafer.

Figure 10A:
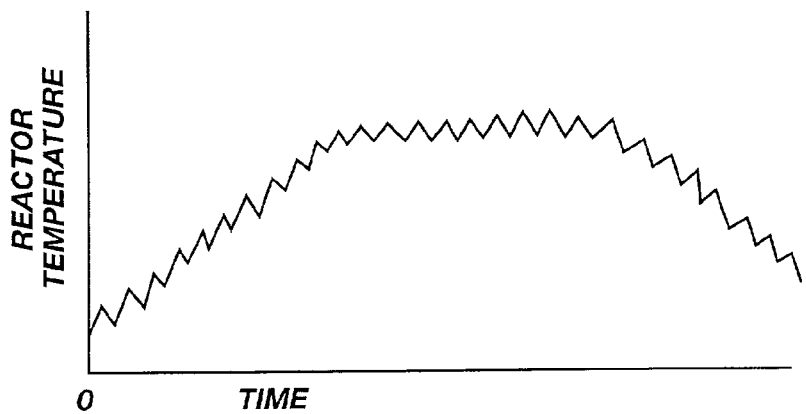
FIGS. 10a through 10e are line graphs which illustrate use of the process of FIG. 7 during different deposition phases.
Figure 10B:
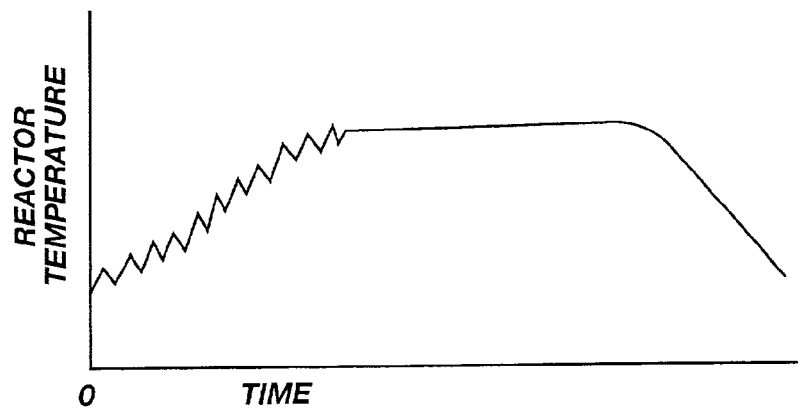
Figure 10C:
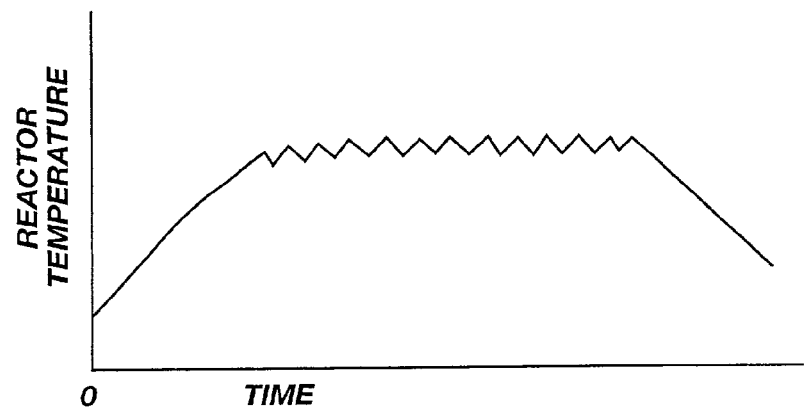
Figure 10D:
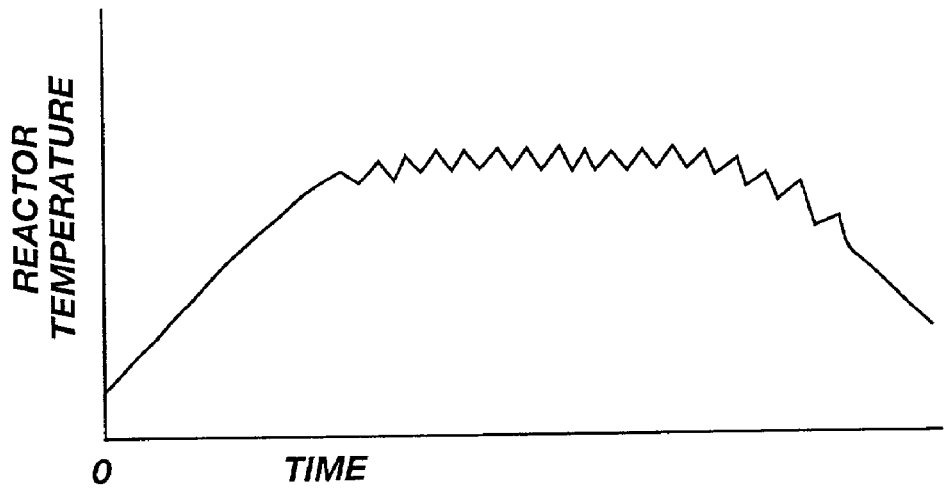
Figure 10E:
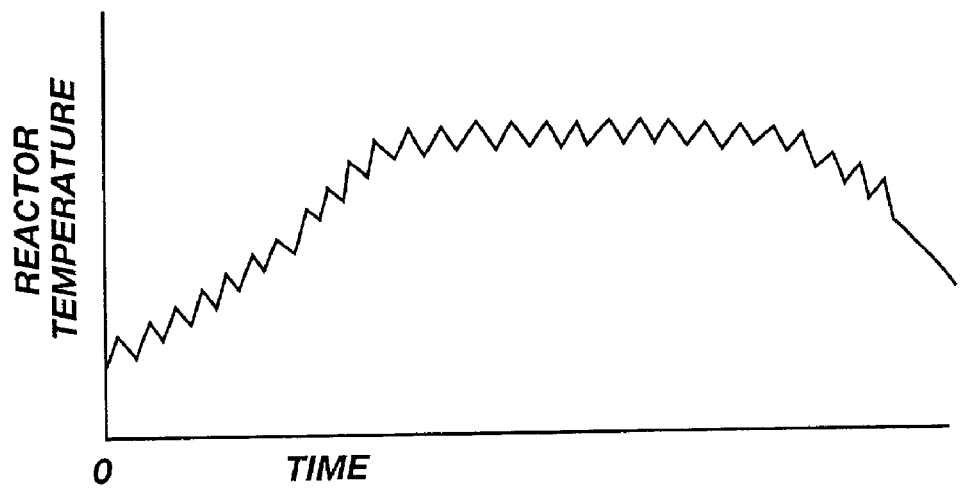

FIGS. 10a through 10e are line graphs which illustrate some of the different temperature trends during which temperature oscillation within the reaction chamber according to the present invention may be utilized. In FIG. 10a, the temperature within the reaction chamber is continually fluctuated during each of the heat-up, anneal, and cool-down phases. FIG. 10b illustrates fluctuation of the temperature within the reaction chamber in the heat-up phase only. FIG. 10c illustrates temperature fluctuation of the reaction chamber temperature only during the "conventional" anneal phase. FIG. 10d shows fluctuation of the temperature within the reaction chamber during the "conventional" anneal phase and the beginning of the cool-down phase. FIG. 10e depicts fluctuation of the temperature within the reaction chamber during the heat-up phase, the "conventional" anneal phase, and at the beginning of the cool-down phase. Similarly, the temperature within the reaction chamber may be fluctuated during any temperature trend during which a layer is formed upon a semiconductor wafer and during the subsequent cooling of the layer and the wafer, including during brief segments of a larger temperature trend.

The process of the present invention may also be employed to form other types of layers upon semiconductor wafers, including, without limitation, oxide, oxynitride, gate hardening, $Si_3N_4$ reoxidation, metal alloying, and other layers.

Figure 12:
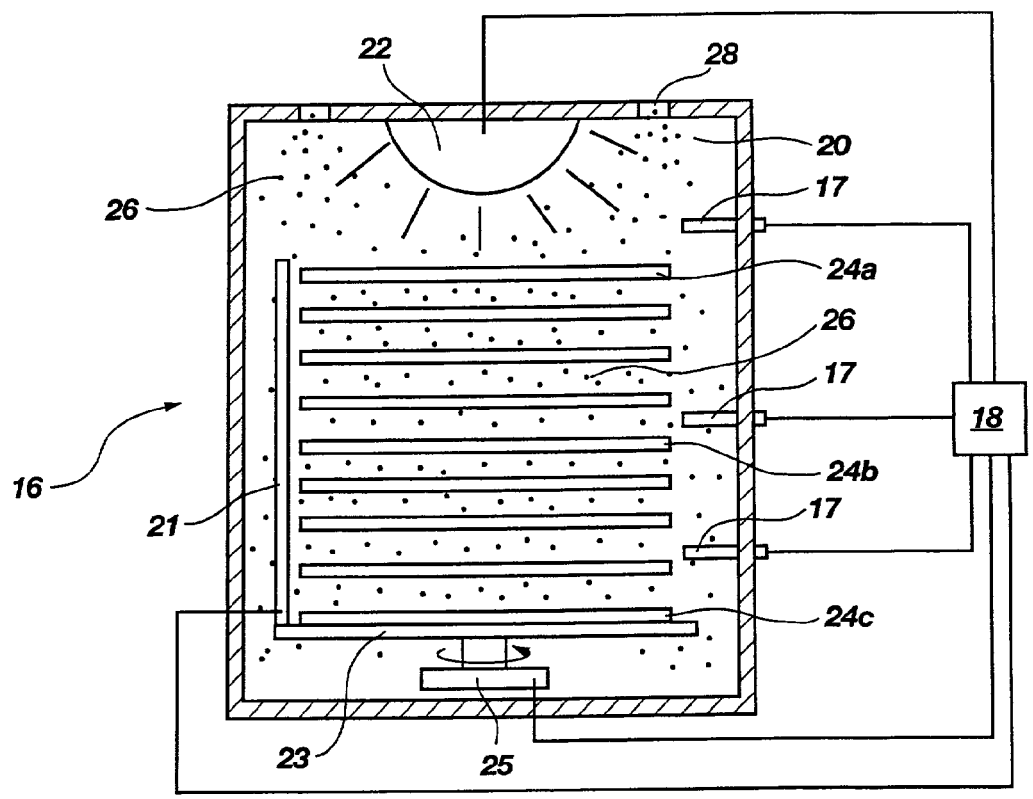
FIG. 12 is a schematic cross-sectional representation of a reaction chamber with semiconductor wafers positioned therein.

An exemplary material layer formation system 16, which is depicted in FIG. 12, includes a reaction chamber 20 with a heating element 22 therein. System 16 may also include a temperature sensor 17, or feedback system, of a type known in the art. Temperature sensor 17 is at least partially located within reaction chamber 20 so as to facilitate measurement of the temperature within reaction chamber 20 or of various portions of a semiconductor wafer 24a, 24b, 24c or other substrate within reaction chamber 20. Semiconductor wafers 24a, 24b and 24c upon which a material layer is to be formed are positioned on a platen 23 in reaction chamber 20. Platen 23 may be rotated by way of a rotator 25. Reaction chamber 20 is heated to a desired temperature by inputting power into heating element 22. As the temperature within reaction chamber 20 increases, the temperature of each of semiconductor wafers 24a, 24b and 24c increases. A heater 21 may also be positioned within reaction chamber 20 so as to increase the temperature of at least an edge of one or more semiconductor wafers 24a, 24b, 24c or other substrates located in reaction chamber 20. When one or more temperature sensors 17 in reaction chamber 20 and/or processing element 18 that receives signals from temperature sensors 17 determine that the temperature of reaction chamber 20 has reached a first, or initial anneal, temperature, matter 26 of a type that will promote the formation of a material layer upon each of semiconductor wafers 24a, 24b and 24c is introduced into reaction chamber 20 through an inlet 28. Preferably, the introduction of matter 26 into reaction chamber 20 is continued until reaction chamber 20 reaches a second, or terminal anneal, temperature.

Preferably, in order to form uniform layers upon semiconductor wafers, the frequency and amount of temperature variation of the process of the present invention are optimized for the type of layer formed, the desired layer properties, and the equipment with which the layer is formed. Similarly, depending upon the initial growth pattern of a formed layer, the amount and rate of temperature variation may be altered or optimized in order to enhance uniformity in the properties of the layer. Moreover, repetition of the process, as well as oscillating the temperature within the reaction chamber, may be employed to form substantially uniform layers upon the surface of a semiconductor wafer.

Similarly, when the temperature within the reaction chamber is oscillated while a layer of a material is being deposited upon a semiconductor wafer, the amount or magnitude of oscillation, as well as the frequency of oscillation, may be altered and optimized in order to enhance uniformity in the layer's properties. Such alteration or oscillation may be responsive to the temperature at various regions of the semiconductor wafer, the initial growth pattern of the layer or a combination thereof.

The overall temperature trend (e.g., increasing, decreasing, steady state) may also be altered from a first trend, or first phase, to a second trend, or second phase, in order to enhance the uniformity in layer properties.

The process of the present invention may be employed by various types of existing systems including, without limitation, hot and cold wall, single wafer and multiple wafer, vertical and horizontal, plasma-enhanced systems with or without wafer rotation, atmospheric pressure, high pressure and low pressure reactors. The inventive process may also be used with systems which are typically incapable of maintaining uniform temperatures throughout their reaction chambers, and were, therefore, previously considered undesirable for forming certain types of layers. Advantageously, substantially uniform layers may be formed in existing semiconductor substrate fabrication equipment without requiring expensive modifications thereto or the replacement thereof.

Systems which monitor the temperatures of various regions of a semiconductor wafer, and which adjust the temperature within the reaction chamber so as to effect the formation of a layer of substantially uniform properties upon the wafer, including equalizing the temperature or the reaction rate across the wafer, may also be employed in combination with the process of the present invention in order to automate the process and enhance the uniformity of layers formed in accordance therewith. An exemplary control system 18, which is also referred to herein as a temperature regulator, is schematically depicted in FIG. 12. Temperature sensor 17, heating element 22, and heater 21 may each be associated with a known type of temperature regulator 18. Temperature regulator 18 receives temperature signals from temperature sensor 17 and activates or deactivates heating element 22 or heater 21 to effect changes in the temperature of reaction chamber 20 or semiconductor wafer 24a, 24b, 24c so as to facilitate the formation of a material of substantially uniform thickness on one or more semiconductor wafers 24a, 24b, 24c or other substrates that have been placed in reaction chamber 20. Systems which monitor the properties of a layer of a material during its formation upon a semiconductor wafer, as well as systems which monitor the overall growth pattern of a layer during its formation upon a semiconductor wafer, may also be employed in combination with the process of the present invention.

Figure 11:
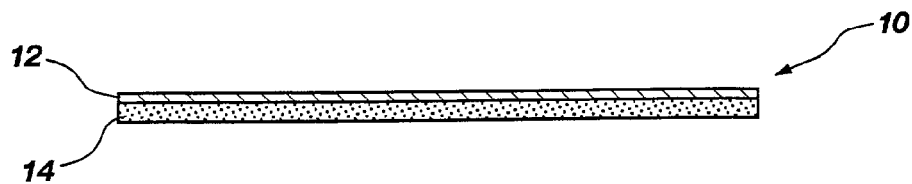
FIG. 11 is a schematic cross-sectional view of a semiconductor substrate which includes a layer of substantially uniform properties which has been formed in accordance with the process of the present invention.

Referring now to FIG. 11, a semiconductor substrate 10 is depicted which includes a material layer 12 of substantially uniform properties that has been formed upon a substrate 14 in accordance with the process of the present invention. Preferably, material layer 12 has a variation in thickness, relative to the mean thickness of the material layer, of less than about 3.5%. Such semiconductor substrates are also within the scope of the present invention.

Although the foregoing description contains many specifics, these should not be construed as limiting the scope of the present invention, but merely as providing illustrations of some of the presently preferred embodiments. Similarly, other embodiments of the invention may be devised which do not depart from the spirit or scope of the present invention. Features from different embodiments may be employed in combination. The scope of this invention is, therefore, indicated and limited only by the appended claims and their legal equivalents, rather than by the foregoing description. All additions, deletions and modifications to the invention as disclosed herein which fall within the meaning and scope of the claims are to be embraced thereby.

What is claimed is:

1. A process for substantially equalizing a temperature across a semiconductor substrate, comprising:
    positioning the semiconductor substrate in a reaction chamber; and
    continuously varying the temperature within the reaction chamber, including oscillating the temperature within the reaction chamber at a substantially constant frequency, to substantially equalize the temperature across the semiconductor substrate.

2. The process of claim 1, wherein continuously varying comprises increasing the temperature within the reaction chamber.

3. The process of claim 2, further comprising cycling the temperature within the reaction chamber following increasing, cycling including decreasing and re-increasing the temperature within the reaction chamber at least once.

4. The process of claim 1, wherein continuously varying comprises decreasing the temperature within the reaction chamber.

5. The process of claim 4, further comprising cycling the temperature within the reaction chamber following decreasing, cycling including increasing and re-decreasing the temperature within the reaction chamber at least once.

6. The process of claim 1, further comprising oscillating the temperature during a temperature ramp-up prior to a formation of a layer of a material.

7. The process of claim 1, further comprising oscillating the temperature during a temperature ramp-down subsequent to a formation of a layer of a material.

8. The process of claim 1, further comprising oscillating the temperature during formation of a layer of a material.

9. The process of claim 1, further comprising altering an overall temperature trend from a first phase to a second phase.

10. The process of claim 1, further comprising altering a frequency of the oscillating.

11. The process of claim 1, further comprising altering a magnitude of the oscillating.

12. The process of claim 1, further comprising optimizing a frequency of the oscillating responsive to an initial growth pattern of a layer of a material to enhance uniformity of a property of the layer.

13. The process of claim 12, wherein optimizing the frequency of the oscillating comprises changing a property of the layer that comprises at least one of thickness, sheet resistance, reflectivity, transmissivity, absorptivity, and dielectric constant.

14. The process of claim 1, further comprising monitoring an initial growth pattern of a layer of a material.

15. The process of claim 14, further comprising optimizing a magnitude of oscillating in response to monitoring to enhance uniformity of a property of the layer.

16. The process of claim 15, wherein optimizing the magnitude of oscillating comprises enhancing a property of the layer that comprises at least one of thickness, sheet resistance, reflectivity, transmissivity, absorptivity, etch characteristics, dopant distribution, and dielectric constant.

17. The process of claim 1, further comprising monitoring an overall growth pattern of a layer of a material.

18. The process of claim 17, further comprising altering the temperature within the reaction chamber responsive to monitoring.

19. The process of claim 17, further comprising altering a rate of varying responsive to monitoring.

20. The process of claim 17, further comprising cycling the temperature within the reaction chamber following continuously varying.

21. The process of claim 1, further comprising monitoring the temperature of the semiconductor substrate.

22. The process of claim 1, wherein varying the temperature is effected by altering a characteristic of power input into the reaction chamber.

23. The process of claim 22, wherein the power characteristic is frequency, amplitude or phase.

24. A process for maintaining a uniform reaction rate over a surface of a semiconductor substrate, comprising:
placing the semiconductor substrate in a reaction chamber;
introducing at least one reactant into the reaction chamber; and
continuously varying a temperature within the reaction chamber during an entire extent of introducing at least one reactant into the reaction chamber to facilitate maintenance of the uniform reaction rate as a reaction involving the at least one reactant results in the deposition of at least one material onto the surface of the substrate, the continuously varying including oscillating the temperature within the reaction chamber.

25. The process of claim 24, wherein continuously varying includes increasing the temperature within the reaction chamber.

26. The process of claim 25, wherein continuously varying includes cycling the temperature within the reaction chamber following increasing, cycling including decreasing and re-increasing the temperature within the reaction chamber at least once.

27. The process of claim 24, wherein continuously varying includes decreasing the temperature within the reaction chamber.

28. The process of claim 27, wherein continuously varying includes cycling the temperature within the reaction chamber following decreasing, cycling including increasing and re-decreasing the temperature within the reaction chamber at least once.

29. The process of claim 24, further comprising effecting oscillating during a temperature ramp-up prior to introducing.

30. The process of claim 24, further comprising effecting oscillating during a temperature ramp-down subsequent to introducing.

31. The process of claim 24, further comprising effecting oscillating during a substantially steady-state temperature trend.

32. The process of claim 24, wherein oscillating comprises varying the temperature at a constant frequency.

33. The process of claim 24, further comprising altering an overall temperature trend from a first phase to a second phase.

34. The process of claim 24, further comprising altering a frequency of oscillating.

35. The process of claim 24, further comprising altering a magnitude of oscillating.

36. The process of claim 24, further comprising optimizing a frequency of oscillating responsive to an initial growth pattern of a layer of a material upon the semiconductor substrate to enhance uniformity of a property of the layer.

37. The process of claim 36, wherein optimizing the frequency of oscillating comprises enhancing a property of the layer that comprises at least one of thickness, sheet resistance, reflectivity, transmissivity, absorptivity, etch characteristics, dopant distribution, and dielectric constant.

38. The process of claim 36, further comprising forming a material layer exhibiting at least one substantially uniform property on the semiconductor substrate.

39. The process of claim 38, wherein optimizing the frequency of oscillating comprises enhancing the at least one substantially uniform property of the layer, the at least one substantially uniform property including at least one of thickness, sheet resistance, reflectivity, transmissivity, absorptivity, etch characteristics, dopant distribution, and dielectric constant.

40. The process of claim 24, further comprising monitoring an initial growth pattern of a layer of a material upon the semiconductor substrate.

41. The process of claim 40, further comprising optimizing a magnitude of oscillating in response to the initial growth pattern of the layer of the material upon the semiconductor substrate to enhance a substantially uniform property of the layer.

42. The process of claim 41, wherein optimizing the magnitude of the oscillating comprises enhancing a substantially uniform property of the layer that comprises at least one of thickness, sheet resistance, reflectivity, transmissivity, absorptivity, etch characteristics, dopant distribution, and dielectric constant.

43. The process of claim 24, further comprising monitoring an overall growth pattern of a layer of a material on the semiconductor substrate.

44. The process of claim 43, further comprising altering the temperature within the reaction chamber responsive to monitoring.

45. The process of claim 43, further comprising altering a rate of varying responsive to monitoring.

46. The process of claim 43, further comprising cycling the temperature within the reaction chamber following continuously varying.

47. The process of claim 24, further comprising monitoring the temperature of the semiconductor substrate.

48. The process of claim 24, wherein continuously varying is effected by altering a frequency, an amplitude, or a phase power characteristic.

49. A process for substantially equalizing a temperature across a semiconductor substrate, comprising:
positioning the semiconductor substrate in a reaction chamber;
oscillating the temperature within the reaction chamber to substantially equalize the temperature across the semiconductor substrate; and
monitoring an initial growth pattern of a layer of a material formed on the semiconductor substrate.

50. The process of claim 49, further comprising optimizing the oscillating in response to the monitoring.

51. A process for substantially equalizing a temperature across a semiconductor substrate, comprising:
positioning the semiconductor substrate in a reaction chamber;
continuously varying the temperature within the reaction chamber to substantially equalize the temperature across the semiconductor substrate;
"following the continuously varying the temperature," cycling the temperature within the reaction chamber; and
monitoring an overall growth pattern of a layer of a material on the semiconductor substrate.

52. The process of claim 51, wherein the temperature is continuously varied in response to the monitoring.

53. The process of claim 51, wherein a rate at which the temperature is varied is altered in response to the monitoring.

* * * * *

UNITED STATES PATENT AND TRADEMARK OFFICE
CERTIFICATE OF CORRECTION

| | | |
|---|---|---|
| PATENT NO. | : 7,651,956 B1 | Page 1 of 1 |
| APPLICATION NO. | : 09/731319 | |
| DATED | : January 26, 2010 | |
| INVENTOR(S) | : Garry Anthony Mercaldi et al. | |

It is certified that error appears in the above-identified patent and that said Letters Patent is hereby corrected as shown below:

In column 16, line 56, in Claim 51, delete ""following" and insert -- following --, therefor.

In column 16, line 56, in Claim 51, delete "temperature,"" and insert -- temperature, --, therefor.

Signed and Sealed this

Twenty-third Day of March, 2010

David J. Kappos
*Director of the United States Patent and Trademark Office*